United States Patent [19]

Hsieh

[11] Patent Number: 4,558,435
[45] Date of Patent: Dec. 10, 1985

[54] MEMORY SYSTEM

[75] Inventor: Peter K. Hsieh, Parsippany, N.J.

[73] Assignee: RCA Corporation, Princeton, N.J.

[21] Appl. No.: 499,397

[22] Filed: May 31, 1983

[51] Int. Cl.⁴ ............................................. G11C 11/40
[52] U.S. Cl. ..................................... 365/203; 365/233
[58] Field of Search ............... 365/189, 190, 194, 195, 365/203, 233

[56] References Cited

U.S. PATENT DOCUMENTS 4,338,679 7/1982 O'Toole .............................. 365/203

FOREIGN PATENT DOCUMENTS 56-165983 12/1981 Japan .................................. 365/203

*Primary Examiner*—Joseph A. Popek
*Attorney, Agent, or Firm*—Joseph S. Tripoli; George E. Haas; Henry I. Schanzer

[57] ABSTRACT

A memory system in which the sequence in which consecutive functions are performed is controlled by sensing the completion of each function before initiating the performance of the next function in the sequence. Sequencing of the functions is made dependent on the internal delays of the memory system, thereby eliminating the need for clocking signals.

5 Claims, 5 Drawing Figures

MEMORY SYSTEM

This invention relates to a memory system and, more particularly, to a memory system in which the timing of certain functions to be performed consecutively is controlled by the system's internal characteristics.

The proper operation of a typical high density memory system requires many consecutive steps. For example, to read data out of the memory, various lines and nodes of the memory must be precharged to a predetermined level before information can be read out of a selected cell. After precharging to the desired level, information can be read out of a selected cell and coupled to a sense amplifier which then amplifies the information signal and renders it suitable for application to external circuitry. These functions (e.g. precharging, reading/sensing, and amplifying) are normally accomplished by generating clocking signals, and applying them to the memory array. The timing of the clocking signals must be arranged such that the time alloted for each function is sufficiently long to ensure that the function is completed under the worst case conditions. As a result, an excessively long period of time has to be allocated to each function because propagation delays vary from system to system due to fabrication and processing variations and, even within the same system, the propagation delays vary as a function of the operating voltage and temperature. Thus, whether a particular memory system has less propagation delays than another or less delay for some operating conditions, the time alloted for precharge, cell selection, data sensing and data amplification must still be made long enough to allow for the longest possible delays.

The need for distinct clock circuitry set to operate the memory under worst case condition is eliminated in memory systems embodying the invention. Memory systems embodying the invention include means responsive to an address change for initiating a sequence of functions within the memory system and further includes means for sensing when a given function within the sequence is completed before initiating the performance of a succeeding function. Thus, the timing of the functions in each system is determined by the internal delays of that system.

In the accompanying drawing, like reference characters denote like components, and FIG. 1 is a simplified block diagram of a memory system embodying the invention;

Figure 1:
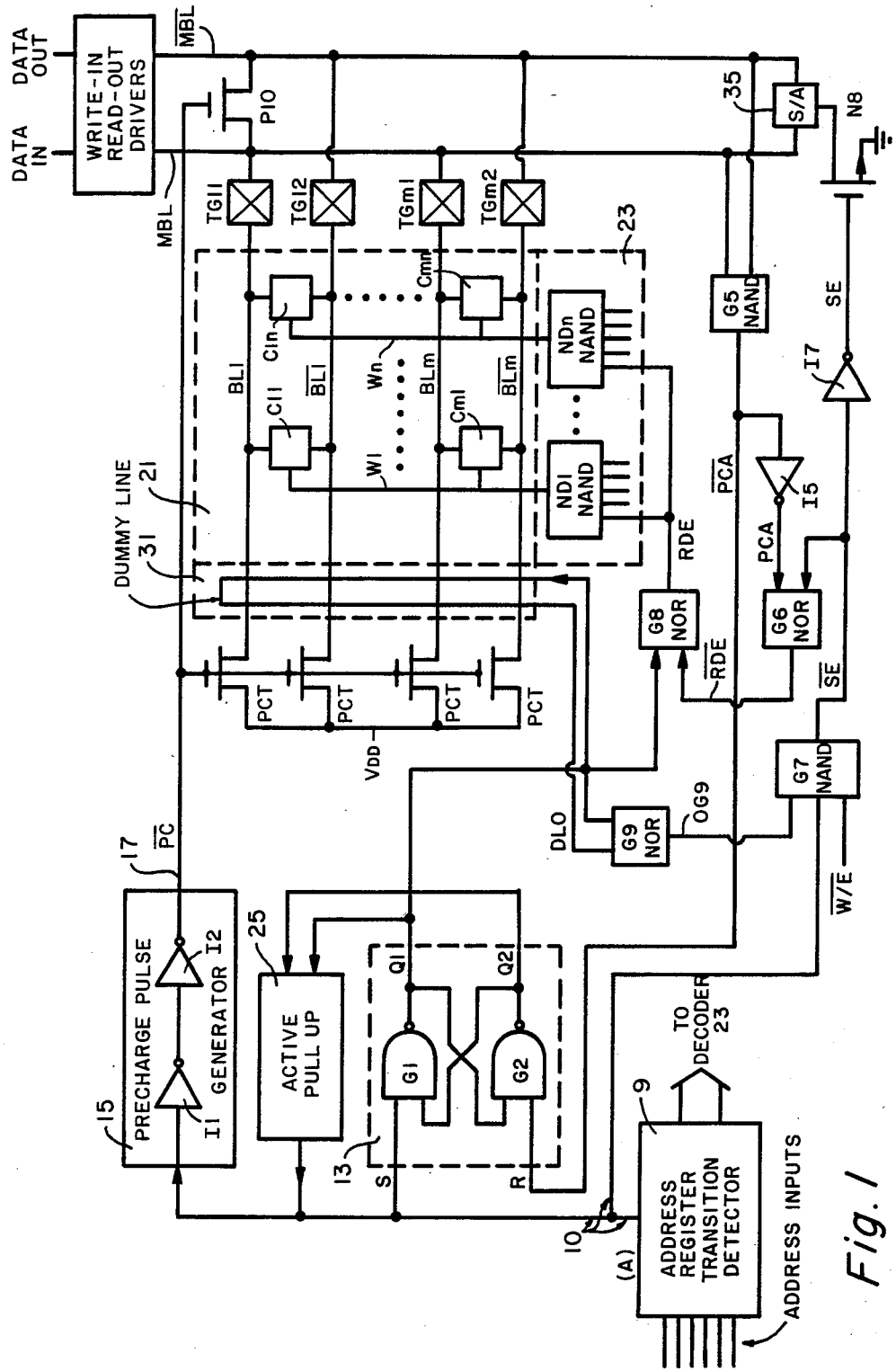

The system of FIG. 1 includes an address register and transition detector section 9 to which are applied the address input lines of the memory system. Whenever a signal on any of the address input lines changes state (i.e., an address changes), a negative-going voltage step is produced at the output of detector/address register 9 which is coupled via lines 10 to one input of a three-input NAND gate G7, to the set (S) input of an address transition register (ATR) 13, and to the input of a precharge pulse generator 15. The output ($\overline{PC}$) of precharge generator 15 is applied via line 17 to the gate electrodes of precharge transistors (PCT) whose conduction paths are connected between a point of $V_{DD}$ volts and the bit lines (BLi or $\overline{BLi}$) of a memory array 21 and to the gate electrode of a voltage equalizing transistor P10 having its conduction path connected between master bit lines (MBL and $\overline{MBL}$).

Figure 5:
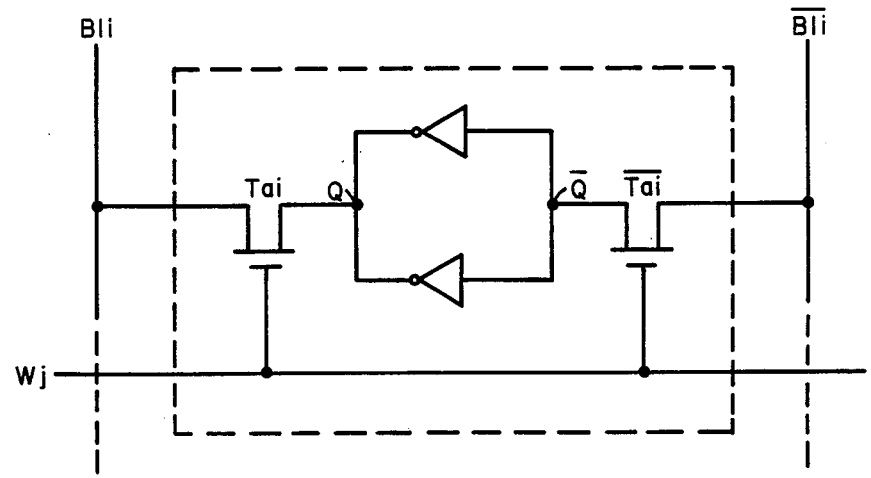
FIG. 5 is a schematic diagram of a memory cell which may be used in a memory array embodying the invention.

Memory 21 includes an array of memory cells arranged in rows and columns. As detailed in FIG. 5, each cell includes two crosscoupled inverters with first and second input-output (I/O) points defined as Q and $\overline{Q}$, with the Q and $\overline{Q}$ outputs coupled via transmission gates Tai and $\overline{Tai}$ to bit lines BLi and $\overline{BLi}$, respectively, where the conductivity of transmission gates Tai and $\overline{Tai}$ is determined by the voltage on the word line Wj. Thus, the input-output (I/O) nodes (Q and $\overline{Q}$) of the cells of a row are connected between complementary bit lines (BLi and $\overline{BLi}$) while the cells of a column are addressed (selected) by a common column conductor or word line (Wj). Each word line is connected to, and driven by, a corresponding NAND gate in a word decoder 23. Each decoding NAND gate in Decoder 23 is responsive to a different condition of the address inputs whereby the decoding NAND gates, when enabled, select one of the word lines at a time. In addition, each NAND gate in decoder 23 has one input connected to the output (RDE-row detector enable-) of a two-input NOR gate G8. G8, which functions to enable or disable decoder 23 is controlled by the Q1 output from register 13 and by the output ($\overline{RDE}$) of a two-input NOR gate G6. Each BLi line of array 21 is connected via a transmission gate TGi1 to the MBL line and each $\overline{BLi}$ line is coupled via a transmission gate TGi2, to the $\overline{MBL}$ line. Thus the complementary (Q and $\overline{Q}$) outputs of a selected cell get coupled to respective MBL and $\overline{MBL}$ lines.

Figure 4:
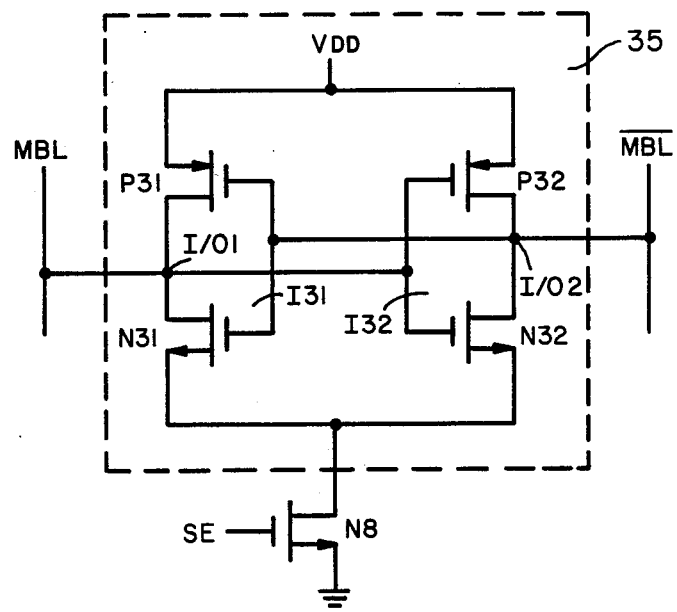
FIG. 4 is a schematic diagram of a sense amplifier which may be used to practice the invention.

The MBL and $\overline{MBL}$ lines are connected to the two inputs of a two-input NAND gate G5 and to the I/O and $\overline{I/O}$ nodes respectively of sense amplifier (S/A) 35 which may be of the type detailed in FIG. 4. The output ($\overline{PCA}$) of G5 is fed back to the reset (R) input of register 13 and to the input of an inverter I5. The output (PCA-precharge acknowledge-) of I5 is applied to one input of NOR gate G6. Memory array 21 includes a dummy line 31 similar in length and composition to the word lines of the array to stimulate the electrical properties of a word line and hence the time it takes for a signal to propagate from an output of a decoding gate in decoder 23 to the cell which is physically farthest from the decoder. The dummy line is connected between the two inputs of NOR gate G9 and, as described below, delays the powering of sense amplifier 35 until the contents of a cell have been read out onto its associated bit lines. The output (OG9) of G9, the output (A) of detector 9, and a write enable (W/E) signal are applied to respective inputs of a three-input NAND gate G7. The output ($\overline{SE}$) of G7 is applied to one input of NOR gate G6 and to the input of an inverter I7. The output (SE-sense enable) of inverter I7 is connected to the gate electrode of a switching transistor N8 whose source drain path is connected in the ground return of sense amplifier 35 so as to selectively apply, or remove, power to sense amplifier 35.

Figure 2:
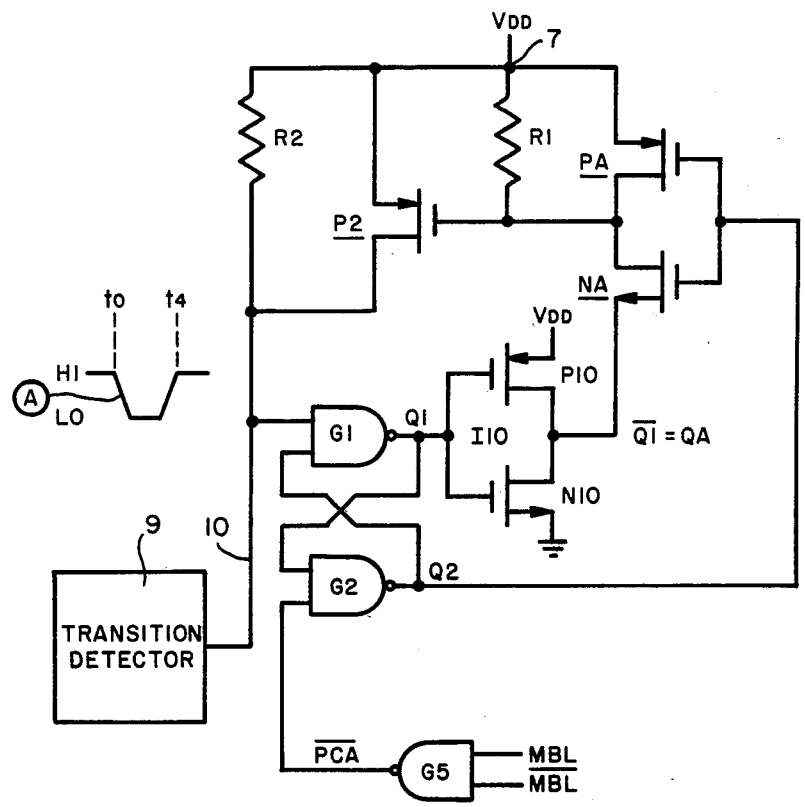
FIG. 2 is a schematic diagram of an active pull-up circuit embodying the invention.

Register 13 is comprised of two two-input NAND gates G1 and G2 which are cross-coupled to form a set/reset flip-flop. The output (Q1) of G1 and the output (Q2) of G2 are applied to an active pull-up circuit 25, detailed in FIG. 2. As shown in FIG. 2, Q1 is applied to the gate electrodes of transistors P10 and N10 which define the input of a complementary inverter I10. The drain electrodes of P10 and N10, which define the output of inverter I10, are connected to the source of a transistor NA whose drain electrode is connected to the drain of a transistor PA and to one end of a resistor R1 and to the gate electrode of a transistor P2. The source electrodes of PA and P2 and the other end of resistor R1 are connected to a terminal 7 to which is applied an operating potential of $V_{DD}$ volts. The drain of P2 is connected to line 10 and a resistor R2 is connected in parallel with the conduction path of P2. Q2 is connected to the gate electrodes of transistors PA and NA. The reset input of G2 is connected to the output ($\overline{PCA}$) of G5 whose two inputs are connected to MBL and $\overline{MBL}$.

In the discussion of the operation to follow, it will be shown that three operative loops are generated in sequence in response to any change of address. The first loop includes precharging the bit lines and inhibiting read out of memory cells until completion of precharge. The second loop includes means enabling the address decoders for data selection and inhibiting the operation of the sense amplifier until the date read-out of a selected cell is established. The third loop includes means for powering the sense amplifier and means responsive to the data read-out being latched in the sense amplifier for then disabling the address decoders and restoring the system to its initial condition prior to the address change.

Figure 3:
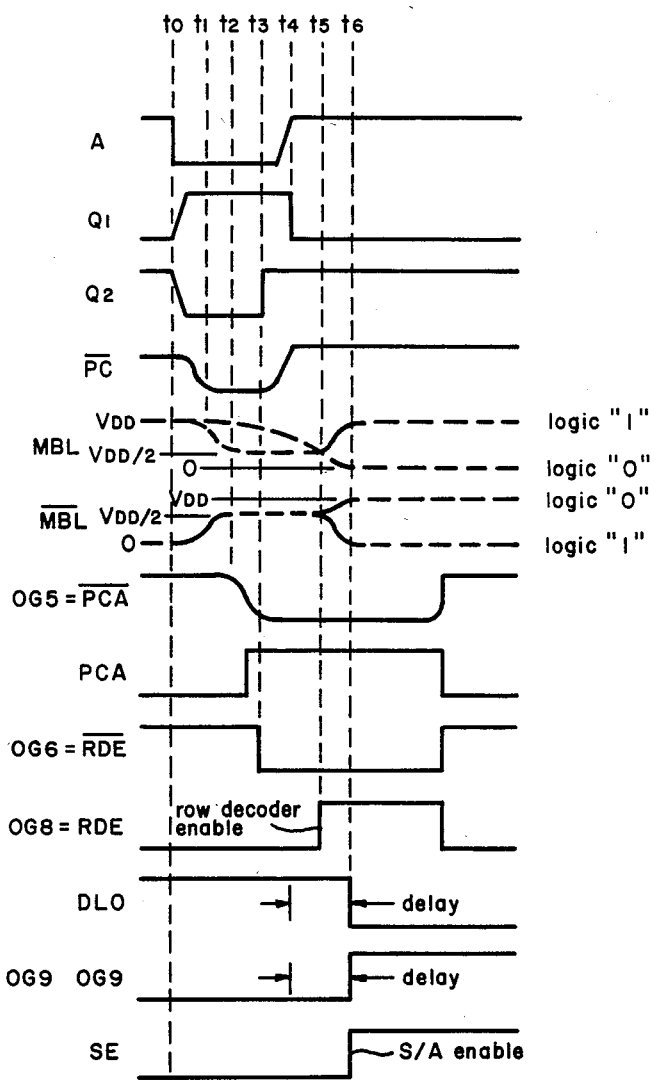
FIG. 3 is a diagram of waveforms generated at various points of the circuits of FIGS. 1 and 2.

In the discussion of the operation of FIG. 1 to follow, assume that the memory system has been placed in the read mode (W/E is set high) in order to read information contained in memory array 21. Assume further that at least one of the address inputs to detector/register 9 has changed state, and that the address change is sensed by a transition detector in detector 9 which, in response thereto, produces at its output a signal A which makes a high-to-low transition at time $t_0$ as shown in FIG. 3. The high-to-low transition of signal (A) applied via line 10 to the set (S) input of flip-flop 13, to the input of precharge circuit 15 and to one input of NAND gate G7 inhibits address decoders 23 and sense amplifier 35 while initiating the precharge of the bit lines.

When A goes low, flip-flop 13 is set such that Q1 goes high and Q2 goes low resulting in the following: (a) Q1 high applied to NOR gate G8 causes its output RDE to be low or to remain low which in turn, causes the outputs of the NAND gates in detector 23 to be driven high or to remain high. In this embodiment, a high on a word line inhibits the selection of that word line. Thus, when Q1 goes high, row selector decoder 23 is disabled preventing the read-out of information from memory array 21. (b) Q1 high is also applied to one input of NOR gate G9, causing its output OG9 to go low and to remain low as long as Q1 is high. OG9 low ensures that the output $\overline{SE}$ of G7 is high or remains high and that SE is low whereby sense amplifier 35 is or remains disabled.

The low A signal applied directly to G7 also causes $\overline{SE}$ to go high and sense amplifier 35 to be disabled.

When A goes low, the output of inverter I1 in precharge pulse generator 15 goes high and the output ($\overline{PC}$) of I2 goes low. Thus, after a short propagation delay through I1 and I2, a negative precharge ($\overline{PC}$) signal is produced on line 17 which is applied to the gate electrodes of the PCT transistors of P-conductivity type. This turns them ON and charges all the bit lines of memory array 21 to, or close to, $V_{DD}$ volts. The bit lines are coupled via transmission gates (TGi1 and TGi2), at least one of which is turned-ON, to the master bit lines (MBL and $\overline{MBL}$) whereby the master bit lines get precharged towards $V_{DD}$ volts. The negative going $\overline{PC}$ signal applied to the gate electrode of P10 of P-conductivity type turns it ON whereby lines MBL and $\overline{MBL}$ are coupled together via its relatively low impedance path and are driven to, or close to, the same potential.

When at some time $t_2$ the MBL and $\overline{MBL}$ lines are charged to a voltage which is greater than $V_{DD}/2$ volts, as shown in FIG. 3 for waveforms MBL and $\overline{MBL}$, the bit lines and the master bit lines are precharged to a desired level and further precharging which is very power consumptive is no longer necessary. The two inputs to G5 are now "high" causing its output ($\overline{PCA}$) to go low. The $\overline{PCA}$-low signal applied to the reset (R) input of register 12 causes Q2 to go high at time $t_3$. As soon as Q2 goes high with Q1 still high, because A is still low, active pull-up circuit 25 is enabled as detailed below and functions to drive line 10 and the signal A to $V_{DD}$ volts The role of the active pull-up circuit in terminating the precharge loop prior to the activation of the data select loop is now discussed.

Before discussing the operation of the pull-up circuit in response to Q1 and Q2 being high, its operation and condition in response to A going low will first be examined. When A goes low at time $t_0$ the set input to G1 goes low causing its output Q1 to go high and Q2 to go low. Referring to FIG. 2, it may be seen that when Q1 goes high, P10 is turned-off, N10 is turned-on and hence, the output Q1 of I10 goes low. Concurrently, Q2-low turns-off NA and turns-on transistor PA which then applies $V_{DD}$ volts to the gate of P2 ensuring its turn-off. Thus, although N10 is turned on and the source of NA is returned to ground via the source drain path of N10, NA is turned-off since Q2 applied to its gate is low. Thus from time $t_0$ to $t_3$ after A goes from high-to-low, (i.e., as long as Q1 is high and Q2 is low) the active pull-up circuit is in a first quiescent low-power dissipation state.

Recall that, while the active pull-up circuit is being placed in the first quiescent state in response to A going low, the low $\overline{PC}$ signal generated at the output of generator 15 causes all the BLi bit and $\overline{BLi}$ lines to be charged towards $V_{DD}$ volts, which in turn causes both lines MBL and $\overline{MBL}$ to be charged towards $V_{DD}$ volts. As soon as the potential on MBL and $\overline{MBL}$ rises above $V_{DD}/2$, the two inputs to G15 go high and its output ($\overline{PCA}$) goes low. $\overline{PCA}$-low is applied to the reset input of G2 and causes Q2 to go high. When Q2 first goes high, Q1 is still high since A is still low. As soon as Q2 goes high, as shown at time $t_3$ in FIG. 2, PA is turned-off while NA is turned-on since Q2-high is applied to its gate and its source is returned to ground via N10. NA, when turned-on, pulls the gate of P2 towards ground turning-it-on. The turn-on of P2, which is a relatively low impedance device, clamps line 10 to $V_{DD}$ volts restoring the signal A back to $V_{DD}$ volts. This assumes that when P2 is turned on that the address change has stabilized and the transition detector 9 output is no longer holding line 10 at, or close to, ground. As soon as A is driven high, Q1 is drive low since Q2 is already high. Q1 low turns-off N10 and turns-on P10 applying $V_{DD}$ volts to the source of NA and thereby interrupting the flow of current through NA. Thus, though Q2-high is still applied to the gate of NA, there can be no conduction through NA. With NA rendered non-conducting, R1 provides a path to charge the gate of P2 to $V_{DD}$ volts which causes P2 to turn-off. Concurrently, the low-to-high transition of A is propagated via precharge pulse generator 15 to cause PC to go high at time $t_4$-$t_5$ turning-off P10 and the PCT transistors. Thus, following any change in address, a precharge signal is generated and when the system senses that both master bit lines are precharged to at least $V_{DD}/2$, the transition detector 9 output signal is restored to its quiescent high level condition and the active pull-up circuit is shut down, and dissipates little, if any, power. Concurrently, transition register (flip-flop) 13 placed in its reset condition (Q1-low, Q2-high) and precharging is terminated.

It will now be shown that read-out of information from a selected memory cell occurs only after the precharge pulse has ended and Q1 is set low. In response to Q1 going low at time $t_4$, the address decoders are enabled and the turn-on of the sense amplifier is delayed until data is read-out and propagated into the bit lines.

After Q1 goes low, the two inputs to NOR gate G8 are now low, the output (RDE) of G8 then goes high at time $t_5$, as shown in FIG. 3, enabling the decoding gates in decoder 23. The decoding gates decode the address inputs and energize a selected word line corresponding to a particular set of addresses. Concurrently, the transmission gates (TGi1, TGi2) corresponding to a selected row and bit lines (BLi and $\overline{BLi}$) are enabled. The contents (Q and $\overline{Q}$) of the memory cell at the intersection of the elected word and bit lines is then read out onto the complementary bit lines. This information is then coupled via the selected transmission gates TGi1 and TGi2 to respective MBL and $\overline{MBL}$ lines.

When Q1 goes low, input 1 to G9 goes low immediately. However, the input 2 of G9 which is connected to the output of the dummy line remains high for the length of time (Td) it takes the Q1-low signal to propagate along the dummy line. Following the time delay Td, the two inputs to G9 are low causing OG9 to go high. OG9-high causes the output ($\overline{SE}$) of G7 to go low since the other two inputs (A and W/E) to G7 are already high. When $\overline{SE}$ goes low, the output of I7 goes high turning-on transistor N8 and enabling sense amplifier 35 at time $t_6$, since N8 provides the ground return for sense amplifier 35. Thus, sense amplifier 35 is first enabled when the information read-out of a selected memory cell is already applied to the bit lines and being propagated to the master bit lines.

Concurrent with the turn-on of sense amplifier 35, $\overline{SE}$-low applied to G6 removes the inhibit applied to gate G6 enabling the output $\overline{RDE}$ of G6 to subsequently go high when PCA goes low.

Sensing and amplification of the data read out from the memory array occurs as follows.

At the time that the information read out of a memory cell is being transferred from the bit lines to the master bit lines, the sense amplifier 35 is enabled. Sense amplifier 35 may be comprised of two cross coupled complementary inverters I31 and I32 as shown in FIG. 4. The operation of this type of circuit is well known in the art and need not be greatly detailed. Suffice it to say that, when transistor N8 is turned on, power is applied across the two inverters I31, I32. Prior to the application of power to the two inverters, the two master bit lines will be at some potential above $V_{DD}/2$. One of MBL and $\overline{MBL}$ will be somewhat more positive than the other in response to the propagation thereon of a logic "1"level and the other one of MBL and $\overline{MBL}$ will be somewhat less positive than $V_{DD}/2$ in response to the propagation thereon of a logic "0" level.

The information read-out of a selected cell into the master bit lines initially functions as a small differential input to the sense amplifier. The sense amplifier when first powered up at time $t_6$ functions as a high gain amplifier and can respond to a small difference in voltage on the master bit lines. The sense amplifier amplifies the small difference and due to regenerative feedback, proceeds to drive the MBL and $\overline{MBL}$ lines to potential, which are close to the values of the operating potentials (i.e. $V_{DD}$ and ground). That is, one master bit line gets clamped to, or close to, $V_{DD}$ and the other one gets clamped to, or close to, ground, as a function of the value of the signal read out from a selected cell and present on the master bit lines when the amplifier is powered. Note that the devices P31, N31, P32 and N32 used to form amplifier 35 will have relatively low impedances so they can readily drive the master bit lines to $V_{DD}$ or ground.

As soon as the voltage on one of the master bit lines goes low, one of the inputs to G5 is driven low and its output ($\overline{PCA}$) goes high. $\overline{PCA}$ high causes PCA to go low. When PCA goes low the output of G6 goes high, since $\overline{SE}$ also applied to G6 is low. The high output of G6 applied to the input of G8 causes its output to go low disabling row select detector 23 and preventing further selection of any cell in memory array 21. This feature results from the realization that since the information read-out of the array is now latched in sense amplifier 35, there is no need to dissipate power and maintain the row decoder or the memory array in a selected condition.

When $\overline{PCA}$ goes high, the reset input to register 13 goes high. However, since FF13 is already reset, i.e. Q1 is low and Q2 is high, $\overline{PCA}$ going high does not alter the state of FF13 which is already reset to its initial (preaddress change) condition. Thus when FF13 is in its reset condition it will hold that reset condition until a subsequent negative-going signal is applied to the set side.

What is claimed is:
1. A memory system comprising:
 input means adapted to receive address signals having an output at which are produced signals of first binary significance when any address signal changes;
 a memory array of cells including a pair of data bit lines and selectively enabled memory adressing means responsive, when enabled, to said address signals for selecting a cell and causing the read-out of its contents onto said data bit lines;
 a normally disabled sense amplifier coupled to said data bit lines;
 precharge means coupled to said input means responsive to a change in said address signals for precharging said data bit lines;
 control means coupled to said input means responsive to said change in said address signals for temporarily inhibiting said selectively enabled memory addressing means; said control means including means responsive to said data bit lines being precharged to a predetermined level for terminating said precharging of said data bit lines and for then enabling said selectively enabled memory addressing means;
 means including delay means responsive to the enabling of said selectively enabled memory address means for delaying the turn-on of said sense amplifier for a given time delay to allow information read-out of a selected cell to be coupled onto said data bit lines, and for, after said given time delay, enabling said sense amplifier; said sense amplifier being of the type which, when enabled, functions as a latch causing said data bit lines to assume complementary binary conditions; and means responsive to said complementary binary conditions on said data bit lines for then disabling said selectively enabled memory address means.

2. The combination as claimed in claim 1 wherein said control means includes means for clamping said output of said input means to a level of second binary significance when said data bit lines are charged to said predetermined level.

3. The combination as claimed in claim 2 wherein said memory array of cells is arranged in rows and columns and includes a pair of complementary bit lines per row of cells, and wherein the cells of a row are connected across its associated pair of complementary bit lines and the cells of a column are connected to a word line, each word line being connected to said selectively enabled addressing means; and wherein said delay means includes a dummy delay line having similar characteristics to said word lines and wherein the length of said dummy delay line is arranged to simulate the longest time needed for a signal to propagate from said selectively enabled addressing means to a memory cell farthest therefrom for simulating the worst case propagation delay along a word line; and wherein each pair of complementary bit lines is selectively coupled to said pair of data bit lines.

4. The combination as claimed in claim 1 wherein said control means includes a flip-flop with set and reset inputs and first and second outputs, said set input being responsive to signals of first binary significance at said output of said input means for setting said first output to one binary value and said second output to the other binary value; said reset input being responsive to said data bit lines being precharged to said predetermined level for setting said second output to said one binary value; and means coupled between said first and second outputs of said set-reset flip-flop and said output of said input means for clamping said output of said input means and said set input to a second level of second binary significance when said first and second outputs are both at said one binary value; said set input being responsive to said second level signal for causing said first output to go to said other binary value.

5. The combination as claimed in claim 4 wherein said means coupled between said first and second outputs of said flip-flop and said output of said input means includes:

a first inverter connected at its input to said first output;

a second inverter having a signal input, a signal output and first and second power terminals, means connecting said signal input to said second output, said first power terminal to the output of said first inverter and said second power terminal to a point of fixed operating potential; and a clamping transistor having its conduction path connected between said point of fixed operating potential and said output of said input means and having its control electrode connected to said output of said second inverter.

* * * * *